United States Patent
Mitikiri et al.

(10) Patent No.: US 8,188,902 B2
(45) Date of Patent: May 29, 2012

(54) TERNARY SEARCH SAR ADC

(75) Inventors: Yujendara Mitikiri, Hyderabad (IN); Visvesvaraya Pentakota, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 129 days.

(21) Appl. No.: 12/858,104

(22) Filed: Aug. 17, 2010

(65) Prior Publication Data

US 2011/0304493 A1 Dec. 15, 2011

(30) Foreign Application Priority Data

Jun. 11, 2010 (IN) .......................... 1622/CHE/2010

(51) Int. Cl.
*H03M 1/34* (2006.01)
(52) U.S. Cl. ..................... 341/163; 341/155; 341/172
(58) Field of Classification Search ............ 341/155, 341/156, 163, 172
See application file for complete search history.

(56) References Cited

U.S. PATENT DOCUMENTS

| | | | |
|---|---|---|---|
| 5,017,920 A | 5/1991 | French | |
| 5,070,332 A | 12/1991 | Kaller et al. | |
| 5,638,072 A * | 6/1997 | Van Auken et al. | 341/141 |
| 6,611,222 B1 | 8/2003 | Murphy | |
| 6,747,589 B2 | 6/2004 | Srinivasan et al. | |
| 7,071,862 B1 | 7/2006 | Scarpulla | |
| 7,265,708 B2 * | 9/2007 | Mitra et al. | 341/172 |
| 7,432,844 B2 | 10/2008 | Mueck | |
| 2005/0200510 A1 * | 9/2005 | Yoshida et al. | 341/155 |
| 2005/0225471 A1 * | 10/2005 | Yukawa | 341/163 |
| 2008/0129573 A1 | 6/2008 | Mueck et al. | |
| 2010/0026546 A1 * | 2/2010 | Ohnhaeuser et al. | 341/172 |

OTHER PUBLICATIONS

"A 10-Bit Algorithmic A/D Converter for Cytosensor Application," Proc. IEEE International Symposium on Circuits and Systems, 2005 (ISCAS 2005), vol. 6, pp. 6186-6189, May 23-26, 2005 (Thirumalai Rengachari, Vivek Sharma, Gabor C. Temes, Un-Ku Moon).

"Research on Electronic Cytosensors Progress Report for 2003," Department of Electrical Engineering & Computer Science, pp. 1-22 (Thirumalai Rengachari and Vivek Sharma).

* cited by examiner

*Primary Examiner* — Jean B Jeanglaude
(74) *Attorney, Agent, or Firm* — John J. Patti; Wade J. Brady, III; Frederick J. Telecky, Jr.

(57) ABSTRACT

Traditionally, successive approximation register (SAR) analog-to-digital converters (ADCs) using binary search algorithms have consumed power by performing unnecessary switching of a capacitive digital-to-analog converter (CDAC) when a CDAC voltage is relatively close to a sampling analog input signal. Here, a SAR ADC is provided that reduces the number of switching events. To accomplish this, a multi-stage comparator is provided that generates multiple output signals for SAR logic. Based on these outputs, the SAR logic can more efficiently switch its CDAC using a ternary search algorithm to reduce power consumption and improve efficiency.

16 Claims, 3 Drawing Sheets

TERNARY SEARCH SAR ADC

CROSS-REFERENCE TO RELATED APPLICATIONS

This application is claims priority from Indian Patent Application No. 1622/CHE/2010, filed Jun. 11, 2010, which is hereby incorporated by reference for all purposes.

TECHNICAL FIELD

The invention relates generally to success approximation register (SAR) analog-to-digital converters (ADCs) and, more particularly, to employing a ternary search algorithm within a SAR ADC.

BACKGROUND

Referring to FIG. 1A of the drawings, the reference numeral 100 generally designates a conventional SAR ADC. ADC 100 generally comprises a capacitive digital-to-analog converter (CDAC) 102, a comparator 104, and SAR logic 106. In operation, the CDAC 102 receives an analog input signal AIN and a reference voltage REF, and by use of a binary search algorithm, SAR logic 106 uses comparison results from the comparator 104 to switch the CDAC 104 to resolve the voltage level of the analog input signal AIN to generate a digital output signal DOUT.

Turning to FIG. 1B, a flowchart 150 depicting a conventional binary search algorithm for ADC 100 can be seen. Initially, for the first iteration or clock cycle (i=1), the SAR logic 106 sets the CDAC voltage VDAC is set to one-half ($\frac{1}{2}$) of a reference voltage REF in step 152. The difference between the CDAC voltage VDAC and the analog input signals AIN (which has been sampled) is compared to an offset voltage in step 154. If the difference of the CDAC voltage VDAC and analog input signal AIN is greater than the offset voltage, then the CDAC voltage VDAC is decremented by $(\frac{1}{2})^2$ for the first iteration (i=1) in step 156; otherwise, the CDAC voltage VDAC is incremented by $(\frac{1}{2})^2$ for the first iteration (i=1) in step 158. The iteration is increased in step 160, and the process (beginning at step 154) is repeated. This process continues until resolution of the analog input signal AIN is achieved with a predetermined accuracy or resolution.

With this type of configuration, though, there are several drawbacks. For example, there is no error margin in the comparison, resulting in a slow resolution of the analog input signal AIN. Additionally, the CDAC 102 is switched at every cycle (for all i's), even though the CDAC voltage VCDAC is close to the analog input voltage AIN. Thus, there is a need for an improved SAR ADC.

Some other examples of conventional circuits are: U.S. Pat. Nos. 6,747,589; 5,017,920; 5,070,332; 6,611,222; 7,071,862; 7,432,844; U.S. Patent Pre-Grant Publ. No. 2008/0129573; Rengachari et al., "A 10-Bit Algorithmic A/D Converter for Cytosensor Application," Proc. *IEEE International Symposium on Circuits and Systems*, 2005 (ISCAS 2005), vol. 6, pp. 6186-6189, May 23-26, 2005; and Sharma et al., "Research on Electronic Cytosensors Progress report for 2003," Department of Electrical & Computer Science, Oregon State University, Nov. 26, 2003.

SUMMARY

A preferred embodiment of the present invention, accordingly, provides an apparatus. The apparatus comprises a capacitive digital-to-analog converter (CDAC) having a resolution of N-bits that receives an analog input signal and a reference voltage; a first comparator stage having: a first comparator having a first input terminal, a second input terminal, and an output terminal, wherein the first input terminal of the first comparator is coupled to the CDAC, and wherein the second terminal of the first comparator receives a first offset voltage; and a second comparator having a first input terminal, a second input terminal, and an output terminal, wherein the first input terminal of the second comparator is coupled to the CDAC, and wherein the second terminal of the second comparator receives the first offset voltage; a plurality of second comparator stages coupled in series with one another in a sequence, wherein each second comparator stage has: an amplifier that is coupled to one of the CDAC and the amplifier from the previous second comparator stage of the sequence; a third comparator having a first input terminal, a second input terminal, and an output terminal, wherein the first input terminal of the third comparator is coupled to the amplifier, and wherein the second terminal of the third comparator receives at least one of a plurality of second offset voltages; and a fourth comparator having a first input terminal, a second input terminal, and an output terminal, wherein the first input terminal of the fourth comparator is coupled to the amplifier, and wherein the second terminal of the fourth comparator receives at least one of a plurality of second offset voltages; and successive approximation register (SAR) logic that is coupled to the output terminals of the first and second comparator from the first comparator stage, the output terminals of the third and fourth comparators from each of the second comparator stages, and the CDAC, wherein the SAR logic controls the CDAC, and wherein the SAR logic performs a successive approximation ternary search using the output values from the first comparator, the second comparator, each third comparator, and each fourth comparator.

In accordance with a preferred embodiment of the present invention, the SAR logic initially sets a CDAC voltage to be one-half of the reference voltage.

In accordance with a preferred embodiment of the present invention, the first comparator receives a positive representation of the first offset voltage, and wherein the second comparator receives a negative representation of the first offset voltage.

In accordance with a preferred embodiment of the present invention, each third comparator receives a positive representation of its second offset voltage, and wherein each fourth comparator receives a negative representation of its second offset voltage.

In accordance with a preferred embodiment of the present invention, the SAR logic, for the m-th bit of the N-bits, decrements the CDAC voltage by $(\frac{1}{2})^{m+1}$ of the reference voltage if the output value from the third comparator of the corresponding second comparator stage is not equal to 0.

In accordance with a preferred embodiment of the present invention, the SAR logic, for the m-th bit of the N-bits, increments the CDAC voltage by $(\frac{1}{2})^{m+1}$ of the reference voltage if the output value from the third comparator of the corresponding second comparator stage is equal to 0 and if the output value from the fourth comparator of the corresponding second comparator stage is not equal to 0.

In accordance with a preferred embodiment of the present invention, the first offset voltage and each of the second offset voltages have the same magnitude.

In accordance with a preferred embodiment of the present invention, the magnitude of the first offset voltage and each of the second offset voltages is $(\frac{1}{2})^3$ of the reference voltage.

In accordance with a preferred embodiment of the present invention, an apparatus is provided. The apparatus comprises a CDAC with a resolution of N-bits having N+1 branches, wherein each branch includes: a switch that receives an analog input signal, a reference voltage, and ground; a common node; and a capacitor that is coupled between the switch and the common node; a first comparator stage having: a first comparator having a first input terminal, a second input terminal, and an output terminal, wherein the first input terminal of the first comparator is coupled to the common node of the CDAC, and wherein the second terminal of the first comparator receives a first offset voltage; and a second comparator having a first input terminal, a second input terminal, and an output terminal, wherein the first input terminal of the second comparator is coupled to the common node of the CDAC, and wherein the second terminal of the second comparator receives the first offset voltage; a plurality of second comparator stages coupled in series with one another in a sequence, wherein each second comparator stage has: an amplifier that is coupled to one of the common node of the CDAC and the amplifier from the previous second comparator stage of the sequence; a third comparator having a first input terminal, a second input terminal, and an output terminal, wherein the first input terminal of the third comparator is coupled to the amplifier, and wherein the second terminal of the third comparator receives at least one of a plurality of second offset voltages; and a fourth comparator having a first input terminal, a second input terminal, and an output terminal, wherein the first input terminal of the fourth comparator is coupled to the amplifier, and wherein the second terminal of the fourth comparator receives at least one of a plurality of second offset voltages; and SAR logic that is coupled to the output terminals of the first and second comparator from the first comparator stage, the output terminals of the third and fourth comparators from each of the second comparator stages, and the switches of the CDAC, wherein the SAR logic controls the switches of the CDAC, and wherein the SAR logic performs a successive approximation ternary search using the output values from the first comparator, the second comparator, each third comparator, and each fourth comparator.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1A:
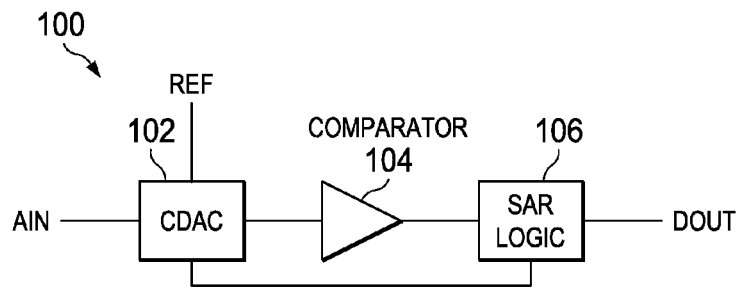
FIG. 1A is an example of a conventional SAR ADC.
Figure 1B:
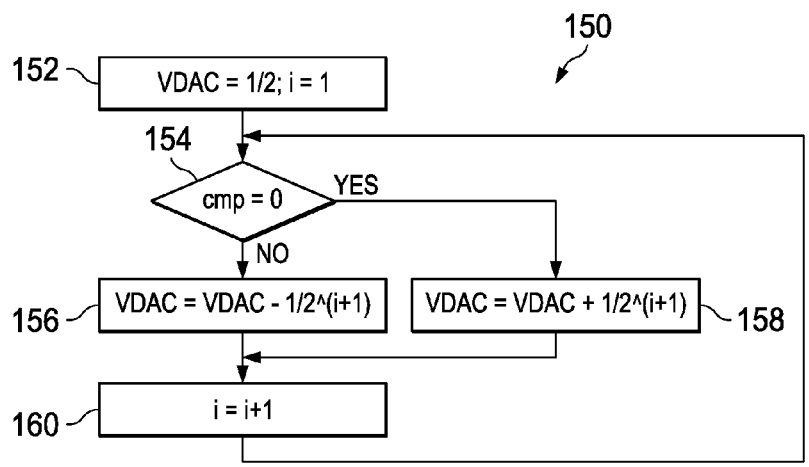
FIG. 1B is an example of a binary search algorithm used in the SAR ADC of FIG. 1.

Refer now to the drawings wherein depicted elements are, for the sake of clarity, not necessarily shown to scale and wherein like or similar elements are designated by the same reference numeral through the several views.

Figure 2B:
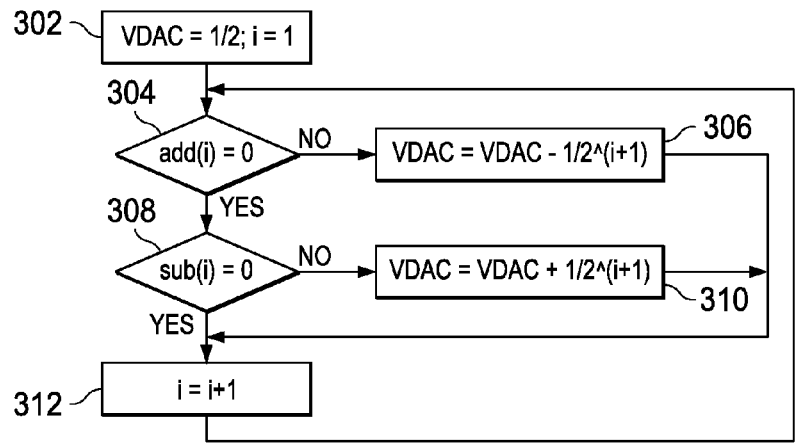
FIG. 2B is an example of a ternary search algorithm used in the SAR ADC of FIG. 3.
Figure 2A:
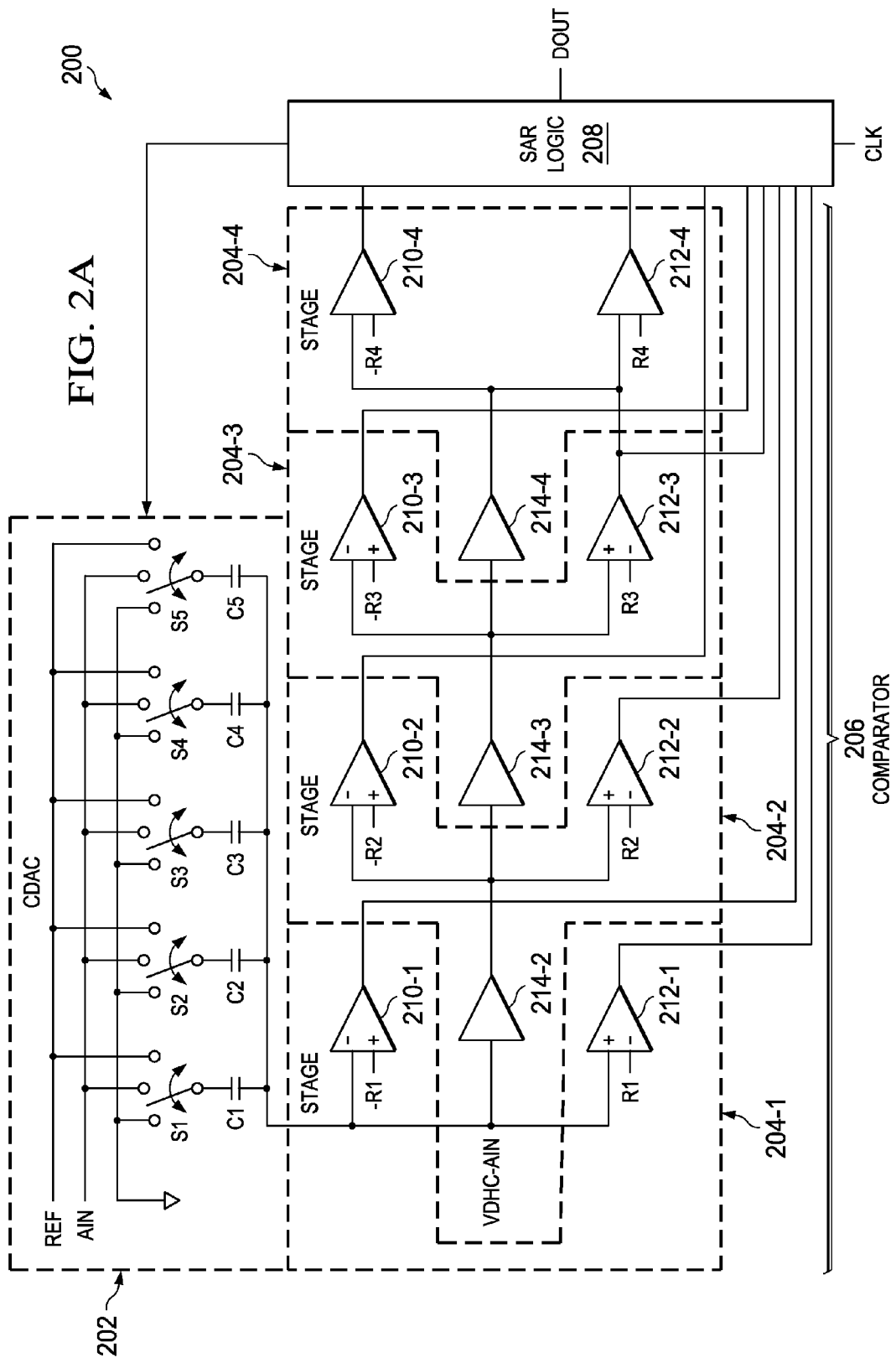
FIG. 2A is an example of a SAR ADC in accordance with a preferred embodiment of the present invention.
Figure 3A:
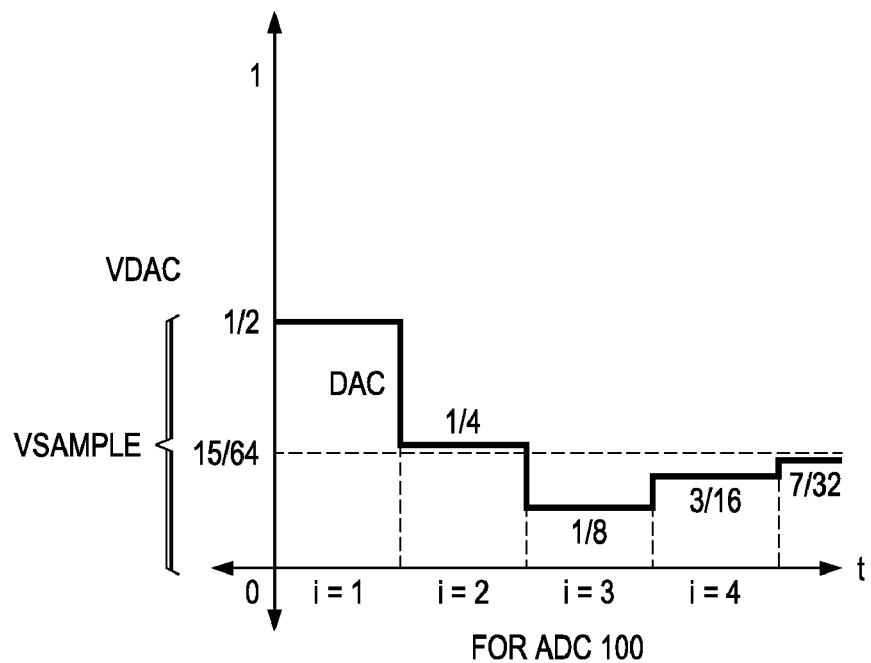
FIG. 3 is a comparison of an example of a conversion for the ADC of FIG. 1A and a conversion for the ADC of FIG. 2A.
Figure 3B:
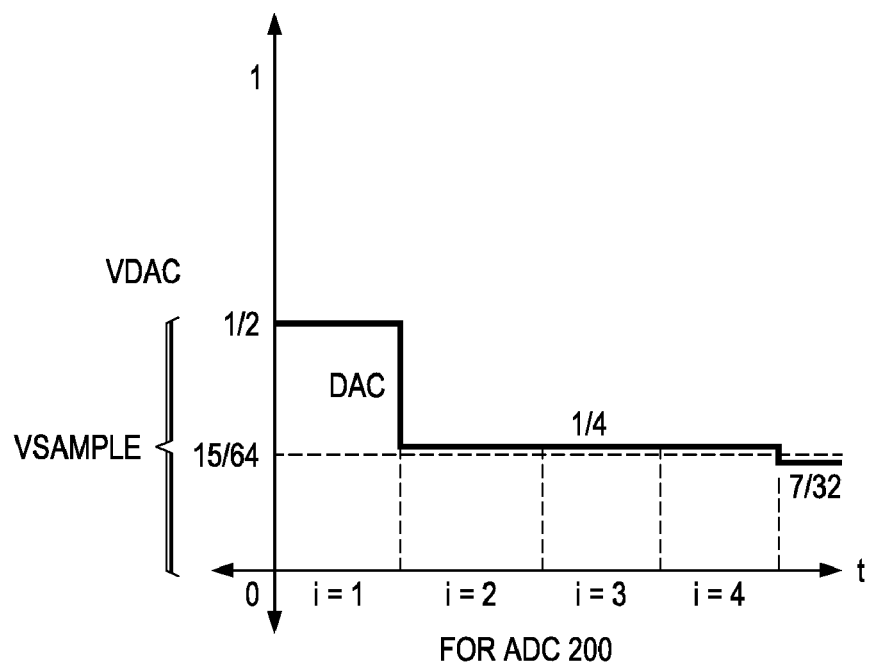

Turning to FIG. 2A, a SAR ADC 200 in accordance with a preferred embodiment of the present invention can be seen. For the sake of simplicity and by way of example, ADC 200 has been illustrated as a 4-bit ADC, but higher resolution ADCs are possible. ADC 200 generally comprises a CDAC 202, a comparator 206, and SAR logic 208. CDAC 202 is a 4-bit ADC having N+1 or five braches (for example with the 4-bit resolution), which each have a capacitor C1 through C5 and a switch 51 through S5. Comparator 206 has multiple stages (i.e., N comparators stages) for an N-bit ADC, but as illustrated comparator 206 has four stages 204-1 to 204-4. The first stage has comparators 210-1 and 212-1. The remaining stages each have an amplifier 214-2, 214-3, or 214-4 and comparators 210-2/212-2, 210-3/212-3, or 210-4/212-4. Thus, there are 2*N logical outputs from comparator 206 to SAR logic 208 for an N-bit ADC (where 8 are shown for example for ADC 200). Additionally, because of the nature of the operation of ADC 200, SAR logic 208 generally includes dynamic error correction logic.

A reason for this configuration is that, for a simpler circuit configuration, offset voltages are generally variable. It is possible to collapse comparator 204 to a single stage having two comparators (i.e., comparators 210-1 and 212-1) that operates over multiple time instants or iterations, instead of having multiple stages (i.e., stages 201-1 to 204-4). However, in order to operate correctly, the reference voltages or offset voltages for the comparators of this single stage, Vt(i), can vary with the iteration or timing instant as follows:

$$Vt(i) = REF/2^{i+2} \pm REF/2^{i+2} \qquad (1)$$

Generating this varying voltage accurately, though, can be very difficult for a large i, but by using multiple stages (as with comparator 204, for example), the reference voltages or offset voltages R1 through R4 for stages 204-1 to 204-3 can have the same large value with a large error tolerance. For example, offset voltages R1 through RN (for N stages) can be REF/$2^3 \pm$REF/$2^3$, or, for any N and i.

Turning to FIG. 2B, a flowchart depicting the ternary search algorithm for ADC 200 can be seen. In step 302, the CDAC voltage VDAC is set to one-half of the reference voltage REF (REF/2) and the increment value (i) is set to 1. Under these circumstances, the increment value (i) corresponds to one of the stages 204-1 to 204-4 in the sequence. In step 304, the difference is provided to the negative input terminal of comparator 210-1 to determine whether the difference is greater than offset −R1 (which can be, for example, −REF/8). If the difference is greater than offset −R1, the CDAC voltage VDAC is decremented by ¼ of the reference voltage REF in step 306. If the difference is less than offset −R1, the output of comparator 210-1 is 0, and in step 308, comparator 212-1 determines whether the difference is less than offset R1. If the difference is less than offset R1, the CDAC voltage VDAC is incremented by ¼ of the reference voltage REF in step 306. Otherwise, or following step 308 or 310, the increment value (i) is increased in step 312.

When the increment value (i) is increased, the SAR logic 208 examines the outputs from a subsequent stage 204-2 to 204-4. For these subsequent stages 204-2 to 204-4, the difference between the sampled analog input signal AIN and CDAC voltage VDAC from the previous stage is amplified. Since each amplifier 214-2, 214-3, and 214-4 is a multiple-by-2 amplifier, the difference is doubled for each stage 214-2, 214-3, and 214-4 from the previous stage. Steps 304, 306, 308, and 310 can then be repeated for each of the remaining stages 214-2, 214-3, and 214-4.

Turning to FIG. 4, a comparison of examples of conversions for ADC 100 and 200 can be seen. In this example, the sampled analog input signal VSAMPLE is 14/64V, and the reference voltage REF is 1V. Looking to the conversion for ADC 100, the voltage selection for the CDAC voltage VDAC for iterations 0 through 4 are ½V, ¼V, ⅛V, 3/16V, and 7/32V. With ADC 200, the voltage selection for the CDAC voltage VDAC for iterations 0 through 4 are ½V, ¼V, 2/8V, 4/16V, and 7/32V. As can clearly be seen, for the same resolution ADCs (4-bits, for example), there are fewer switching events for CDAC 202 of ADC 200 than CDAC 102 of ADC 100 when the CDAC 202 or 102 is close to the sampled analog input signal VSAMPLE. This means that there are significant power savings with ADC 200 as compared to ADC 100. Additionally, the addition of redundancy allows the throughput of ADC 200 to be significantly increased when compared to ADC 100 with a relatively small increase in complexity.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
a capacitive digital-to-analog converter (CDAC) having a resolution of N-bits that receives an analog input signal and a reference voltage;
a first comparator stage having:
a first comparator having a first input terminal, a second input terminal, and an output terminal, wherein the first input terminal of the first comparator is coupled to the CDAC, and wherein the second terminal of the first comparator receives a first offset voltage; and
a second comparator having a first input terminal, a second input terminal, and an output terminal, wherein the first input terminal of the second comparator is coupled to the CDAC, and wherein the second terminal of the second comparator receives the first offset voltage;
a plurality of second comparator stages coupled in series with one another in a sequence, wherein each second comparator stage has:
an amplifier that is coupled to one of the CDAC and the amplifier from the previous second comparator stage of the sequence;
a third comparator having a first input terminal, a second input terminal, and an output terminal, wherein the first input terminal of the third comparator is coupled to the amplifier, and wherein the second terminal of the third comparator receives at least one of a plurality of second offset voltages; and
a fourth comparator having a first input terminal, a second input terminal, and an output terminal, wherein the first input terminal of the fourth comparator is coupled to the amplifier, and wherein the second terminal of the fourth comparator receives at least one of a plurality of second offset voltages; and
successive approximation register (SAR) logic that is coupled to the output terminals of the first and second comparator from the first comparator stage, the output terminals of the third and fourth comparators from each of the second comparator stages, and the CDAC, wherein the SAR logic controls the CDAC, and wherein the SAR logic performs a successive approximation ternary search using the output values from the first comparator, the second comparator, each third comparator, and each fourth comparator.

2. The apparatus of claim 1, wherein the SAR logic initially sets a CDAC voltage to be one-half of the reference voltage.

3. The apparatus of claim 2, wherein the first comparator receives a positive representation of the first offset voltage, and wherein the second comparator receives a negative representation of the first offset voltage.

4. The apparatus of claim 3, wherein each third comparator receives a positive representation of its second offset voltage, and wherein each fourth comparator receives a negative representation of its second offset voltage.

5. The apparatus of claim 4, wherein the SAR logic, for the m-th bit of the N-bits, decrements the CDAC voltage by $(\frac{1}{2})^{m+1}$ of the reference voltage if the output value from the third comparator of the corresponding second comparator stage is not equal to 0.

6. The apparatus of claim 5, wherein the SAR logic, for the m-th bit of the N-bits, increments the CDAC voltage by $(\frac{1}{2})^{m+1}$ of the reference voltage if the output value from the fourth comparator of the corresponding second comparator stage is not equal to 0.

7. The apparatus of claim 6, wherein the first offset voltage and each of the second offset voltages have the same magnitude.

8. The apparatus of claim 7, wherein the magnitude of the first offset voltage and each of the second offset voltages is $(\frac{1}{2})^3$ of the reference voltage.

9. An apparatus comprising:
a CDAC with a resolution of N-bits having N+1 branches, wherein each branch includes:
a switch that receives an analog input signal, a reference voltage, and ground;
a common node; and
a capacitor that is coupled between the switch and the common node;
a first comparator stage having:
a first comparator having a first input terminal, a second input terminal, and an output terminal, wherein the first input terminal of the first comparator is coupled to the common node of the CDAC, and wherein the second terminal of the first comparator receives a first offset voltage; and
a second comparator having a first input terminal, a second input terminal, and an output terminal, wherein the first input terminal of the second comparator is coupled to the common node of the CDAC, and wherein the second terminal of the second comparator receives the first offset voltage;
a plurality of second comparator stages coupled in series with one another in a sequence, wherein each second comparator stage has:
an amplifier that is coupled to one of the common node of the CDAC and the amplifier from the previous second comparator stage of the sequence;
a third comparator having a first input terminal, a second input terminal, and an output terminal, wherein the first input terminal of the third comparator is coupled to the amplifier, and wherein the second terminal of the third comparator receives at least one of a plurality of second offset voltages; and a fourth comparator having a first input terminal, a second input terminal, and an output terminal, wherein the first input terminal of the fourth comparator is coupled to the amplifier, and wherein the second terminal of the fourth comparator receives at least one of a plurality of second offset voltages; and SAR logic that is coupled to the output terminals of the first and second comparator from the first comparator stage, the output terminals of the third and fourth comparators from each of the second comparator stages, and the switches of the CDAC, wherein the SAR logic controls the switches of the CDAC, and wherein the SAR logic performs a successive approximation ternary search using the output values from the first comparator, the second comparator, each third comparator, and each fourth comparator.

10. The apparatus of claim 9, wherein the SAR logic initially sets a CDAC voltage to be one-half of the reference voltage.

11. The apparatus of claim 10, wherein the first comparator receives a positive representation of the first offset voltage, and wherein the second comparator receives a negative representation of the first offset voltage.

12. The apparatus of claim 11, each third comparator receives a positive representation of its second offset voltage, and wherein each fourth comparator receives a negative representation of its second offset voltage.

13. The apparatus of claim 12, wherein the SAR logic, for the m-th bit of the N-bits, decrements the CDAC voltage by $(\frac{1}{2})^{m+1}$ of the reference voltage if the output value from the third comparator of the corresponding second comparator stage is not equal to 0.

14. The apparatus of claim 13, wherein the SAR logic, for the m-th bit of the N-bits, increments the CDAC voltage by $(\frac{1}{2})^{m+1}$ of the reference voltage if the output value from the third comparator of the corresponding second comparator stage is equal to 0 and if the output value from the fourth comparator of the corresponding second comparator stage is not equal to 0.

15. The apparatus of claim 14, wherein the first offset voltage and each of the second offset voltages have the same magnitude.

16. The apparatus of claim 15, wherein the magnitude of the first offset voltage and each of the second offset voltages is $(\frac{1}{2})^3$ of the reference voltage.

* * * * *

UNITED STATES PATENT AND TRADEMARK OFFICE
CERTIFICATE OF CORRECTION

PATENT NO. : 8,188,902 B2  
APPLICATION NO. : 12/858104  
DATED : May 29, 2012  
INVENTOR(S) : Yujendra Mitikiri and Visvesvaraya Pentakota Page 1 of 1

It is certified that error appears in the above-identified patent and that said Letters Patent is hereby corrected as shown below:

Title Page, Item (75) Inventors:

The first inventor's name as listed "Yujendara Mitikiri," should be --Yujendra Mitikiri--.

Signed and Sealed this  
Ninth Day of April, 2013

Teresa Stanek Rea  
*Acting Director of the United States Patent and Trademark Office*